(12) United States Patent
Teng et al.

(10) Patent No.: US 9,575,298 B2
(45) Date of Patent: Feb. 21, 2017

(54) LIGHT COLLECTOR

(71) Applicant: National Taiwan Normal University, Taipei (TW)

(72) Inventors: Tun-Chien Teng, Taipei (TW); Wei-Che Lai, Taipei (TW)

(73) Assignee: National Taiwan Normal University, Taipei (TW)

( * ) Notice: Subject to any disclaimer, the term of this patent is extended or adjusted under 35 U.S.C. 154(b) by 167 days.

(21) Appl. No.: 14/680,413

(22) Filed: Apr. 7, 2015

(65) Prior Publication Data

US 2016/0299325 A1 Oct. 13, 2016

(51) Int. Cl.
*G02B 19/00* (2006.01)

(52) U.S. Cl.
CPC ....... *G02B 19/0023* (2013.01); *G02B 19/0042* (2013.01)

(58) Field of Classification Search
CPC ......... G02B 13/10; G02B 17/04; G02B 23/02; G02B 5/04; G02B 5/045; G02B 7/18; G02B 7/1805; G02B 7/181; G02B 7/1815; G02B 27/24; G02B 17/002; G02B 6/003; G02B 6/124; G02B 6/1245; G02B 6/2848; G02B 6/32; G02B 6/322; G02B 6/325

USPC .................. 359/831–837, 851, 852
See application file for complete search history.

(56) References Cited

U.S. PATENT DOCUMENTS

| | | | | |
|---|---|---|---|---|
| 7,280,275 | B2 * | 10/2007 | Schluchter | G02B 27/285 |
| | | | | 359/485.04 |
| 8,279,523 | B2 * | 10/2012 | Yamada | G02B 5/3083 |
| | | | | 359/485.04 |
| 9,202,958 | B2 * | 12/2015 | Krasnov | H01L 31/0543 |
| 2013/0306138 | A1 * | 11/2013 | Freedman | E06B 9/24 |
| | | | | 136/246 |
| 2015/0331212 | A1 * | 11/2015 | Contag | G02B 6/4292 |
| | | | | 385/14 |

* cited by examiner

*Primary Examiner* — Jennifer L. Doak
(74) *Attorney, Agent, or Firm* — LeClairRyan

(57) ABSTRACT

A light collector includes: a light guide; optical blocks, each of which has top and bottom surfaces and front and rear surfaces which extend curvedly and frontwardly from the top surface to the bottom surface, the rear surface exhibiting total internal reflection and having a focal point; and optical coupling protrusions, each of which protrudes from the bottom surface, each of which is disposed at the focal point and each of which is coupled to the light-entrance surface of the light guide. The front surface of one of every two adjacent ones of the optical blocks overlaps the rear surface of the other of every two adjacent ones of the optical blocks along a normal direction of the light guide.

13 Claims, 10 Drawing Sheets

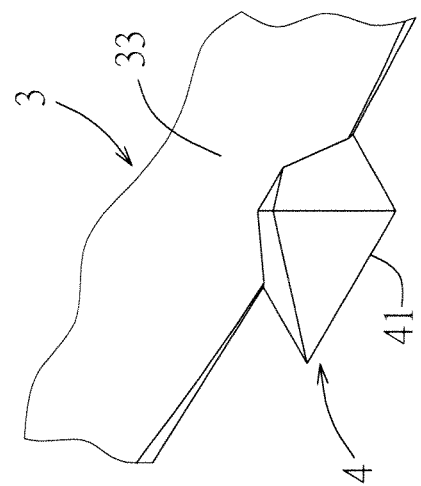
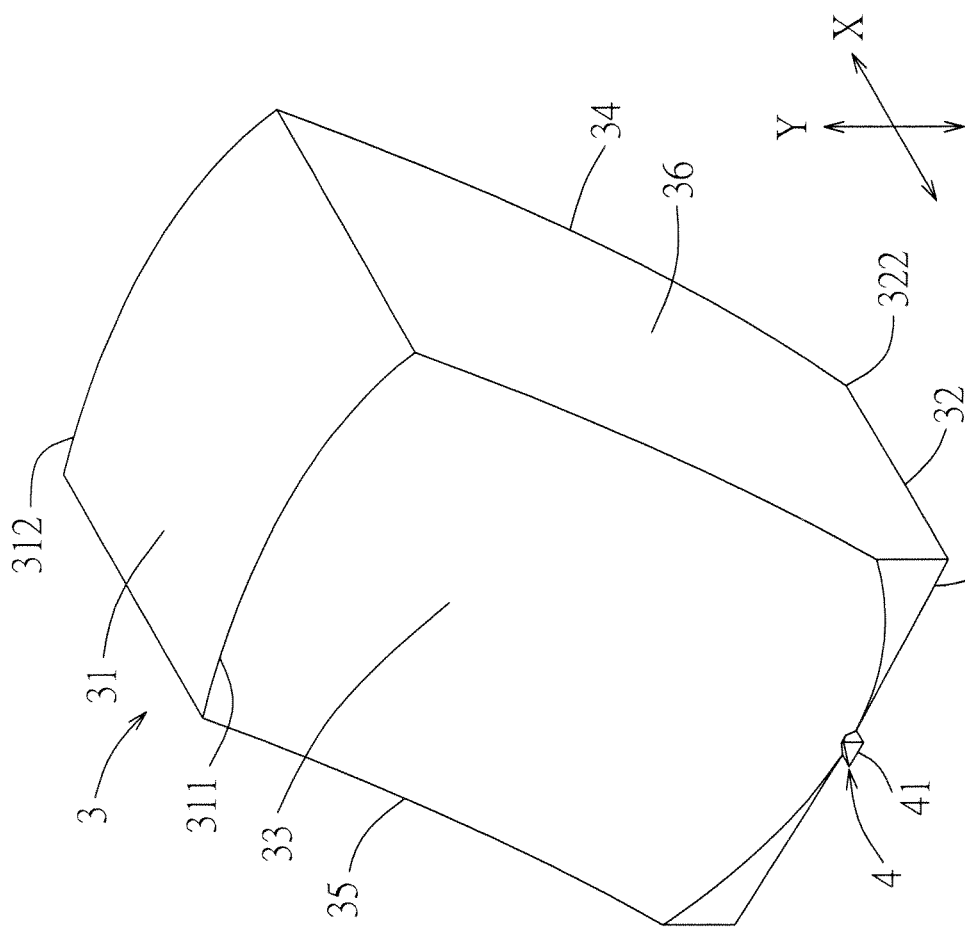

LIGHT COLLECTOR

FIELD

The disclosure relates to a light collector, more particularly to a light collector having optical blocks, each of which has front and rear surfaces extending curvedly and frontwardly from a top surface to a bottom surface thereof.

BACKGROUND

Referring to FIG. 1, U.S. Patent Application Publication No. 2013/0233384 discloses a light collector that includes a light guide layer 114 and a light insertion layer 112 disposed over the light guide layer 114. The light insertion layer 112 includes a plurality of pie-shaped annular bodies 172 made from a material, such as silicone. Each of the pie-shaped annular bodies 172 has a planar edge surface 170, a parabolic surface 160, and a planar interface 159 that is annular in shape and that is deformed so as to be brought into contact with a contact surface 130 of the light guide layer 114. The planar interface 159 of each of the pie-shaped annular bodies 172 forms an optical exit of the light insertion layer 112, such that the light insertion layer 112 is formed with an array of the optical exits. The optical exits cooperate with the contact surface 130 of the light guide layer 114 to form an array of annular optical apertures. In operation, light 122 entering each of the pie-shaped annular bodies 172 is reflected by the parabolic surface 160 via total internal reflection (TIR) toward the optical exit and pass through the optical aperture into the light guide layer 114. The planar interface 159 of each of the pie-shaped annular bodies 172 is small in area relative to the size of the pie-shaped annular body 172, thereby reducing the amount of light 122 that will escape the light guide layer 114 through the optical aperture and not thus be available for harvesting.

Referring to FIG. 2, the aforesaid conventional light collector is disadvantageous in that since the planar edge surface 170 is straight and is transverse to the light guide layer 114, light 122 reflected from the parabolic surface 160 may travel through the planar edge surface 170, which results in incorrect focus and a decrease in converging the light 122, which, in turn, results in a decrease in light coupling efficiency. In addition, the shape of the pie-shaped annular bodies 172 renders the light collector to have a low fill factor in area, which results in a decrease in the light collecting efficiency for the light collector.

SUMMARY

Therefore, an object of the present disclosure is to provide a light collector that can overcome at least one of the aforesaid drawbacks associated with the prior art.

According to the present disclosure, there is provided a light collector that comprises: a light guide having a light-entrance surface; a plurality of spaced apart optical blocks that are disposed over the light-entrance surface of the light guide and that are arranged in an array, the array including at least one row of the optical blocks, each of the optical blocks having top and bottom surfaces and front and rear surfaces, the bottom surface being spaced apart from the light-entrance surface of the light guide by a clearance and having front and rear edges, the front and rear surfaces extending curvedly and frontwardly from the top surface to the front and rear edges of the bottom surface, respectively, and being aligned with each other along a row direction, the rear surface exhibiting total internal reflection and having a focal point such that light reflected from the rear surface converge at the focal point, the focal point being disposed adjacent to the front edge of the bottom surface and distal from the rear edge of the bottom surface; and a plurality of optical coupling protrusions, each of which protrudes outwardly from the bottom surface of a corresponding one of the optical blocks, each of which is disposed at the focal point of the rear surface, and each of which is coupled to the light-entrance surface of the light guide for coupling the light reflected from the rear surface into the light guide. The front surface of one of every two adjacent ones of the optical blocks overlaps the rear surface of the other of every two adjacent ones of the optical blocks along a normal direction of the light guide that is transverse to the row direction. The front surface of one of every two adjacent ones of the optical blocks cooperates with the rear surface of the other of every two adjacent ones of the optical blocks to define a gap therebetween.

BRIEF DESCRIPTION OF THE DRAWINGS

Other features and advantages of the present disclosure will become apparent in the following detailed description of the embodiment with reference to the accompanying drawings, of which:

FIG. 4 is a top perspective view of an assembly of an optical block and an optical coupling protrusion of the first embodiment;

FIG. 5 is a fragmentary perspective view of the assembly of the optical block and the optical coupling protrusion of the first embodiment;

DETAILED DESCRIPTION

Figure 1:
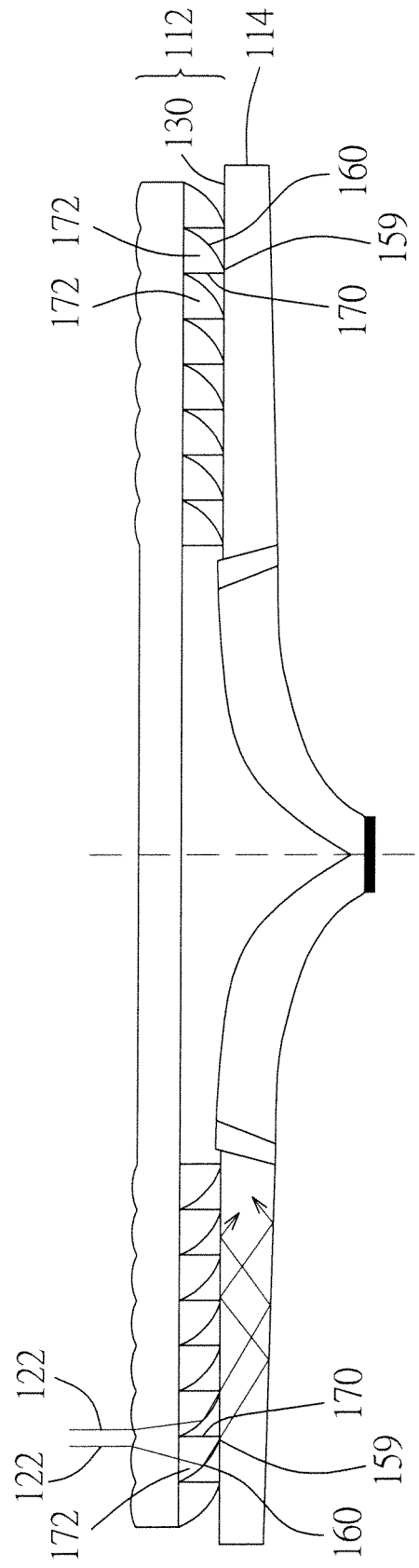
FIG. 1 is a schematic view of a conventional light collector.
Figure 2:
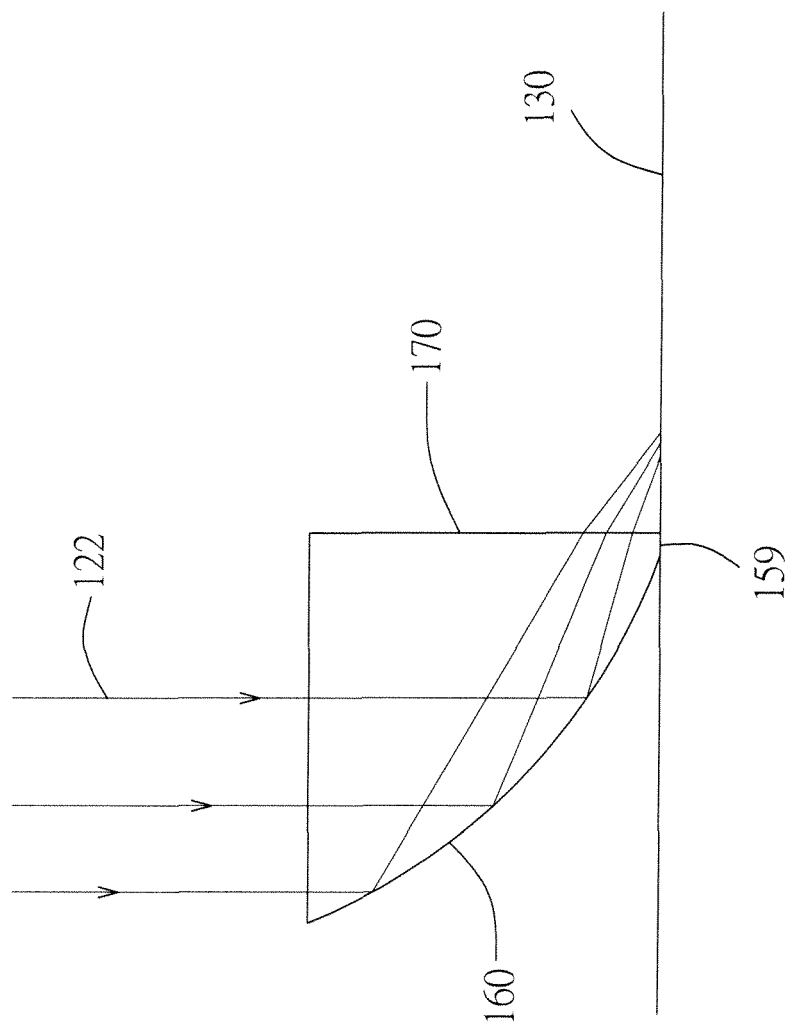
FIG. 2 is a schematic view illustrating how light travel through a planar edge surface of a pie-shaped annular body of the conventional light collector.
Figure 3:
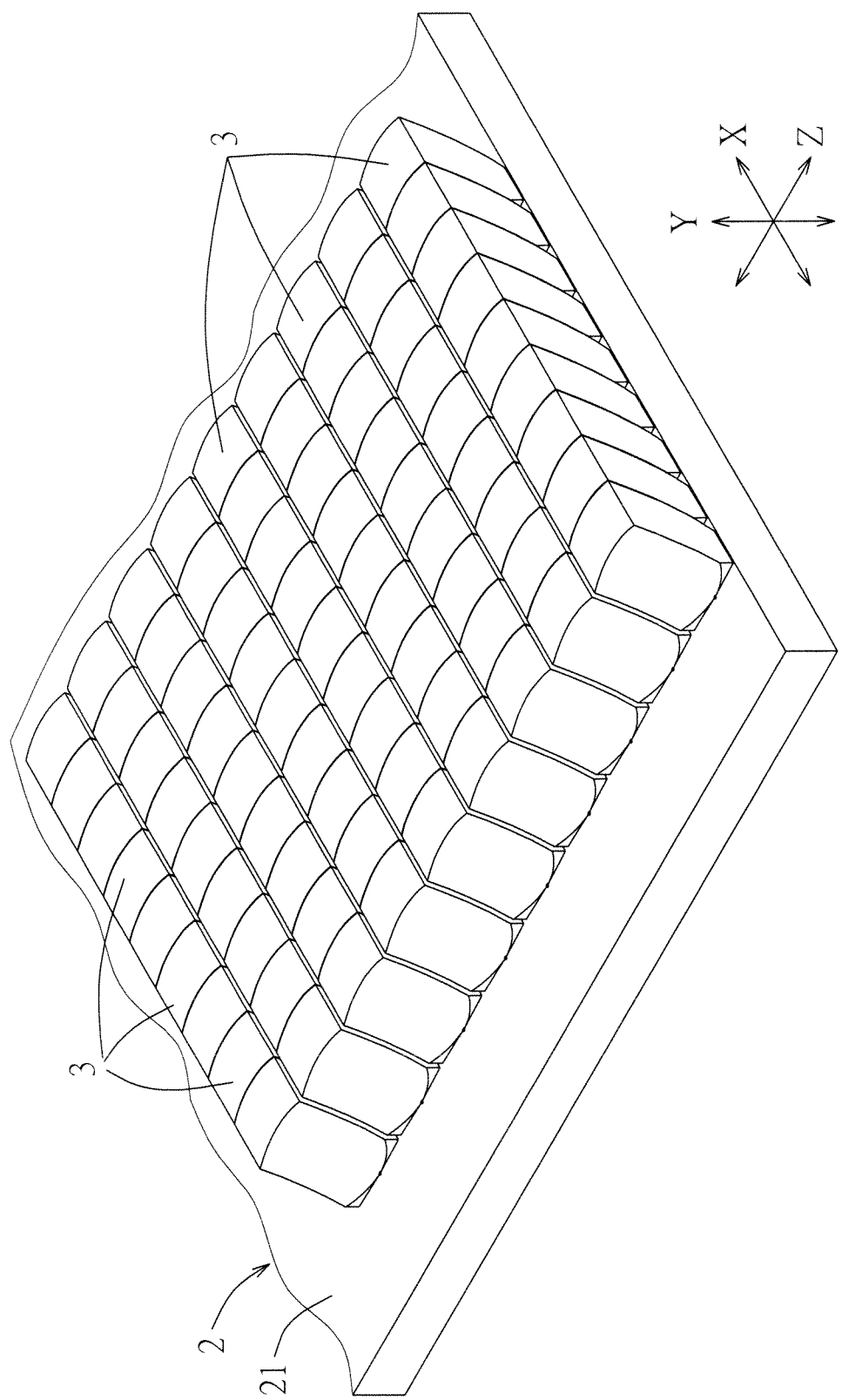
FIG. 3 is a top perspective view of the first embodiment of a light collector according to the present disclosure.
Figure 6:
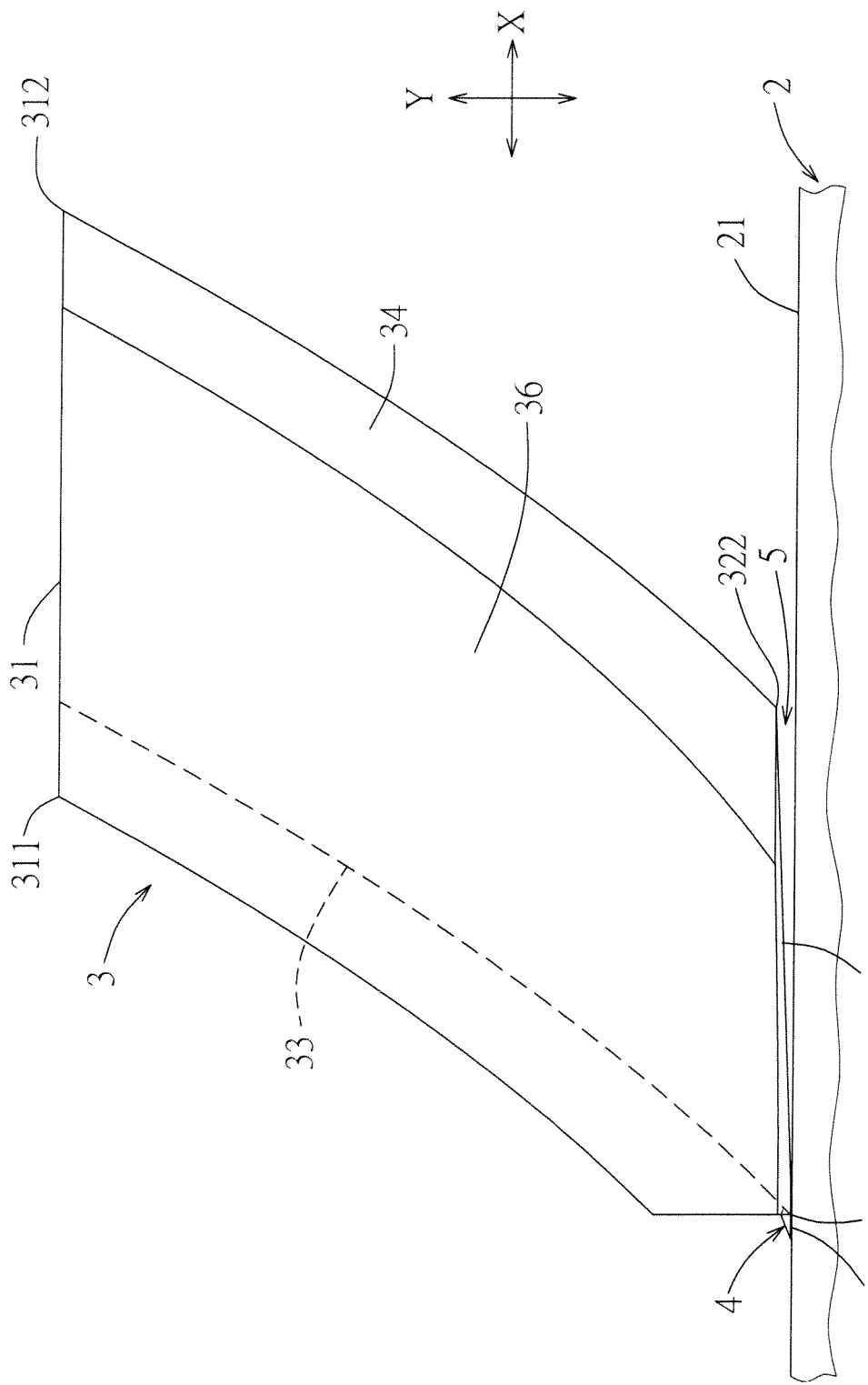
FIG. 6 is a fragmentary side view of an assembly of a light guide, one of the optical blocks and one of the optical coupling protrusion of the first embodiment.
Figure 7:
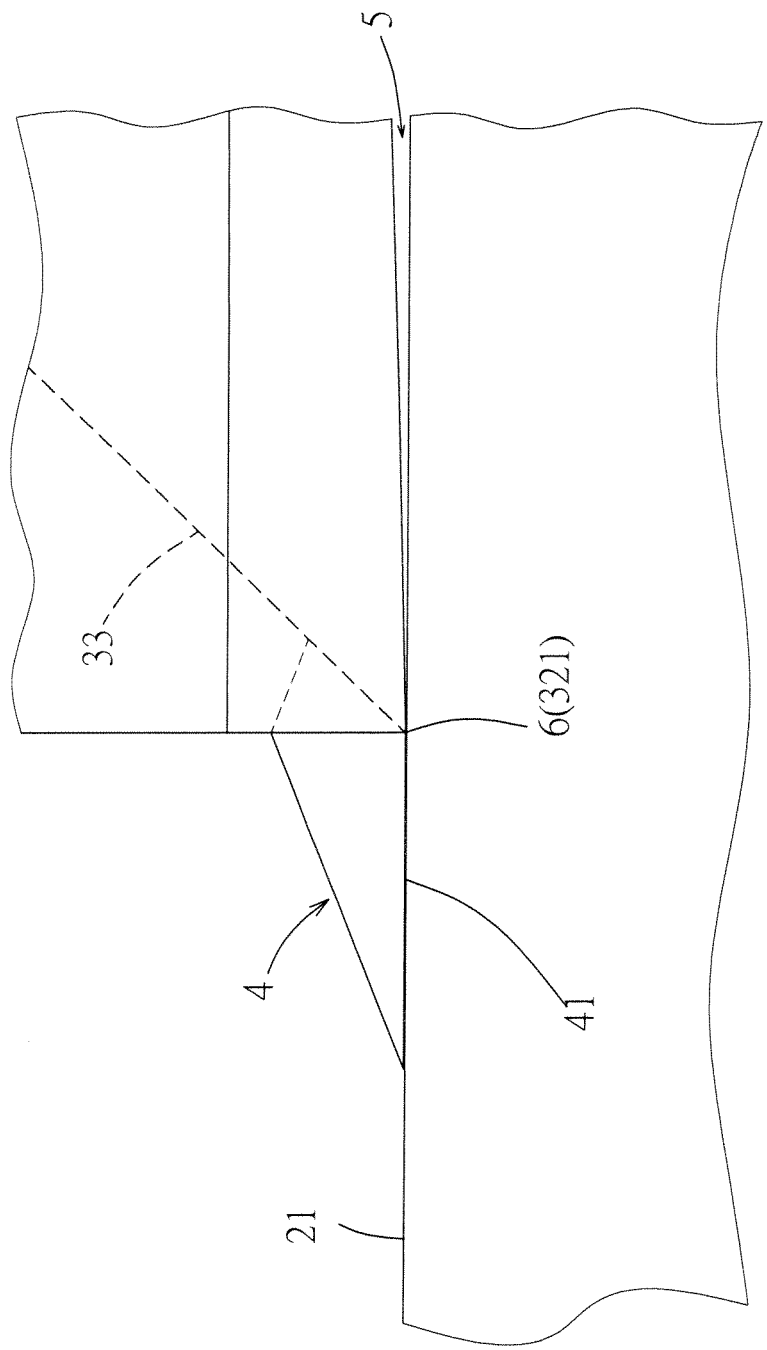
FIG. 7 is an enlarged fragmentary side view of the assembly of FIG. 6.
Figure 8:
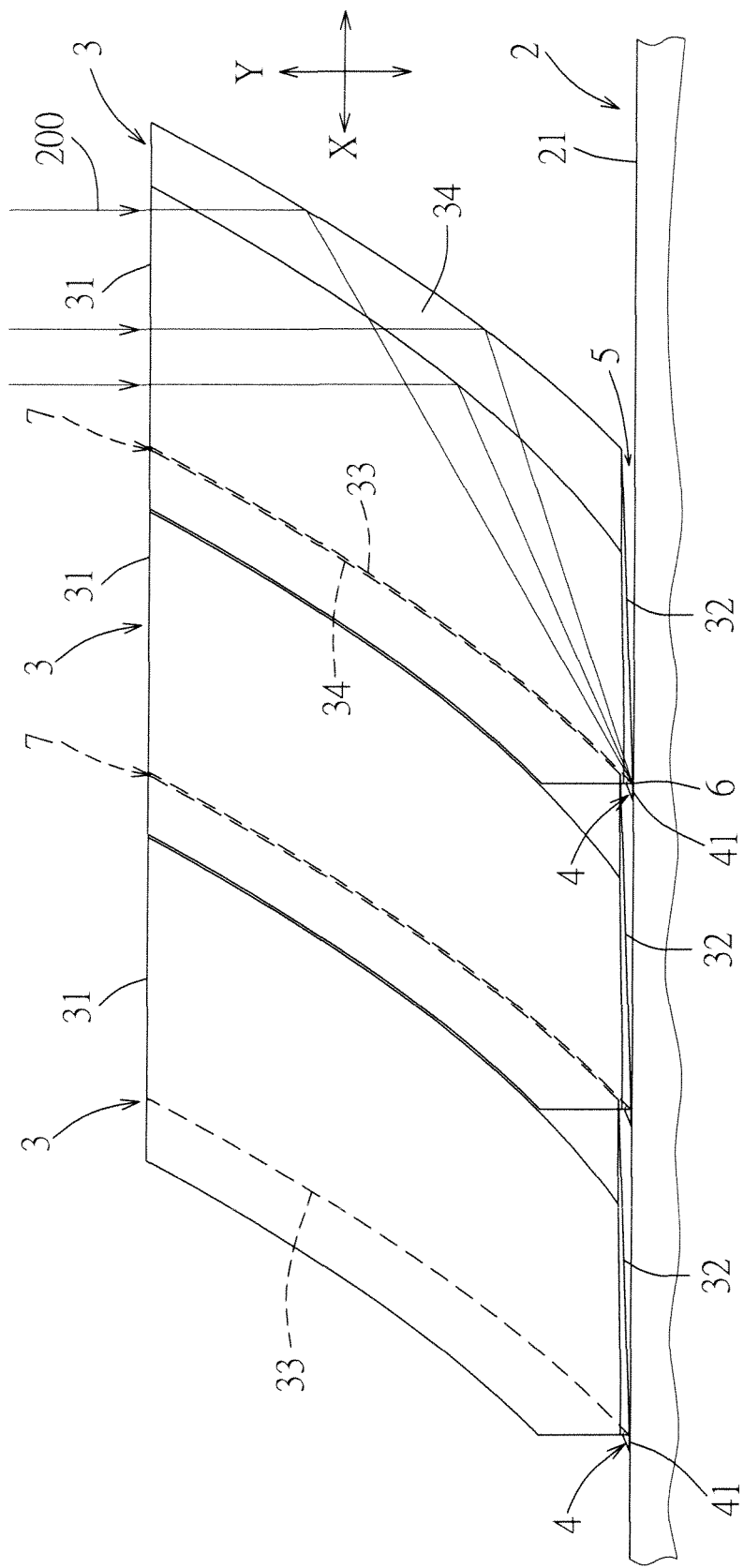
FIG. 8 is a fragmentary side view illustrating how light reflected from a rear surface of the optical block of the first embodiment converge at a focal point.
Figure 9:
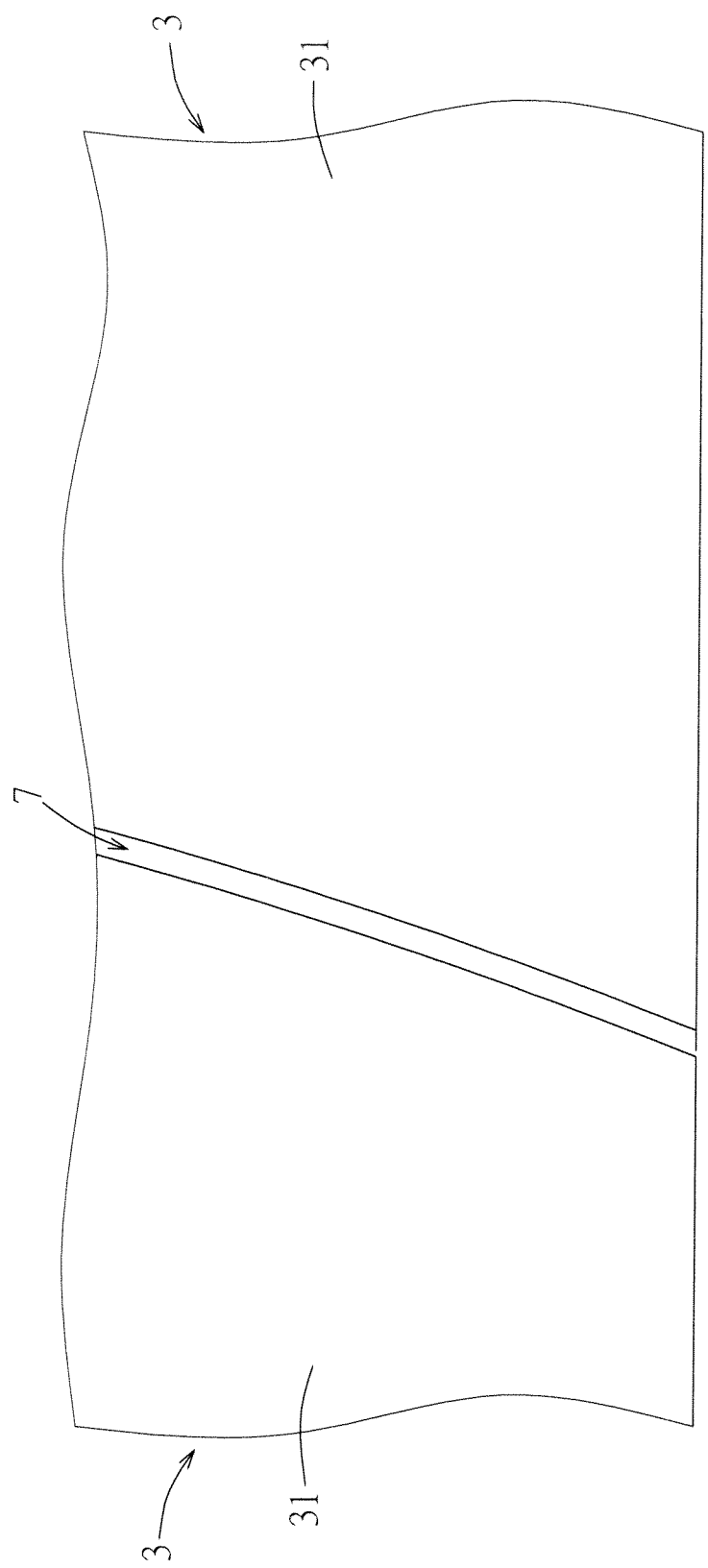
FIG. 9 is a fragmentary top view of the first embodiment.

FIGS. 3 to 9 illustrate the first embodiment of a light collector according to the present disclosure. The light collector can be used to collect light, such as solar energy, for devices, such as photovoltaic devices.

The light collector includes a light guide 2 having a light-entrance surface 21, a plurality of spaced apart optical blocks 3, and a plurality of optical coupling protrusions 4.

The optical blocks 3 are disposed over the light-entrance surface 21 of the light guide 2, have the same shape and size, and are arranged in an array. The array includes at least one row of the optical blocks 3 that are aligned along a row direction (X). In certain embodiments, each of the optical blocks 3 has a height of 15 mm, a width of 15 mm and a length of 9.9 mm, and the array of the optical blocks 3 includes a plurality of parallel rows, such that the array is arranged into a rectangular shape. It is noted that the dimensions of the optical blocks 3 may vary according to actual requirements suitable for various applications. In certain embodiments, each of the optical blocks 3 may have dimensions in the order of micro-scale or meter-scale.

Each of the optical blocks 3 has top and bottom surfaces 31, 32 and front and rear surfaces 33, 34. The bottom surface 32 is spaced apart from the light-entrance surface 21 of the light guide 2 by a clearance 5 (filled with air, see FIGS. 6 to 8), and has front and rear edges 321, 322 which are opposite to each other in the row direction (X). The clearance 5 has a maximum width between the bottom surface 32 and the light-entrance surface 21 that may suitably range from 0.1 mm to 1 mm. The clearance 5 may vary according to actual requirements. The front and rear surfaces 33, 34 extend curvedly and frontwardly from the top surface 31 to the front and rear edges 321, 322 of the bottom surface 32, respectively, and are aligned with each other along the row direction (X). The rear surface 34 exhibits total internal reflection, and has a focal point 6 (see FIGS. 7 and 8) such that light 200 reflected from the rear surface 34 may converge at the focal point 6. The focal point 6 is disposed adjacent to or at the front edge 321 of the bottom surface 32 and distal from the rear edge 322 of the bottom surface 32. Since the front and rear surfaces 33, 34 extend curvedly and frontwardly from the top surface 31 to the bottom surface 32, the aforesaid drawbacks regarding the incorrect focus and the decrease in converging the light, in which the light reflected from the parabolic surface travels through the planar edge surface, as encountered in the prior art can be eliminated or alleviated.

Each of the optical coupling protrusions 4 protrudes outwardly from the bottom surface 32 of a corresponding one of the optical blocks 3, is disposed adjacent to or at the focal point 6 of the rear surface 34, and is coupled to the light-entrance surface 21 of the light guide 2 for coupling the light 200 (see FIG. 8) reflected from the rear surface 34 into the light guide 2. Each of the optical coupling protrusions 4 has a dimension ranging from 0.1 mm to 1 mm. The dimension of each optical coupling protrusion 4 may vary according to actual requirements.

The front surface 33 of one of every two adjacent ones of the optical blocks 3 overlaps the rear surface 34 of the other of every two adjacent ones of the optical blocks 3 along a normal direction (Y) of the light guide 2 that is transverse to the row direction (X). The front surface 33 of one of every two adjacent ones of the optical blocks 3 cooperates with the rear surface 34 of the other of every two adjacent ones of the optical blocks 3 to define an air gap 7 therebetween (see FIGS. 8 and 9). The air gap 7 has a width along the row direction (X) that may range from 0.1 mm to 1 mm. The width of the air gap 7 may vary according to actual requirements.

In certain embodiments, each of the optical coupling protrusions 4 is in contact with the light-entrance surface 21 of the light guide 2 so as to couple the light 200 reflected from the rear surface 34 into the light guide 2. Alternatively, each of the optical coupling protrusions 4 may be coupled to the light-entrance surface 21 of the light guide 2 through an optical lens (not shown) that is disposed between the optical coupling protrusion 4 and the light-entrance surface 21 of the light guide 2.

In certain embodiments, the front surface 33 of each of the optical blocks 3 is substantially parallel to the rear surface 34 of the each of the optical blocks 3, and the front surface 33 of one of every two adjacent ones of the optical blocks 3 is substantially parallel to the rear surface 34 of the other of every two adjacent ones of the optical blocks 3. The top surface 31 has front and rear edges 311, 312 that are opposite to each other along the row direction (X). The rear edge 312 of the top surface 31 of one of every two adjacent ones of the optical blocks 3 is substantially aligned with the rear edge 322 of the bottom surface 32 of the other of every two adjacent ones of the optical blocks 3 along the normal direction (Y) of the light guide 2.

In certain embodiments, the rear surface 34 of each of the optical blocks 3 is parabolic, and the bottom surface 32 of each of the optical blocks 3 is planar and is approximately parallel to the light-entrance surface 21 of the light guide 2.

Each of the optical blocks 3 further has first and second side surfaces 35, 36 that extend between the top and bottom surfaces 31, 32 and between the front and rear surfaces 33, 34, and that are substantially transverse to the light-entrance surface 21 of the light guide 2. The first and second side surfaces 35, 36 of each of the optical blocks 3 are planar, and are parallel to each other. As such, the optical blocks 3 can achieve a very compact arrangement, such that the fill factor in area of the light collector of the present disclosure approaches 1.

In certain embodiments, every two adjacent ones of the optical blocks 3, which are aligned with each other along a transverse direction (Z) (see FIG. 3) that is transverse to the row direction (X) and the normal direction (Y), maybe spaced apart from each other along the transverse direction (Z) according to actual requirements. Alternatively, in certain embodiments, every two adjacent ones of the optical blocks 3, which are aligned with each other along the transverse direction (Z), may be in contact with each other (not shown) according to actual requirements.

Each of the optical coupling protrusions 4 is tapered, and has a planar bottom surface 41 that is in contact with the light-entrance surface 21 of the light guide 2.

In certain embodiments, the light guide 2 may have a thickness of about 2 mm, a width of 300 mm, and a length of about 6 m. The dimensions of the light guide 2 may vary according to actual requirements.

In certain embodiments, each of the optical blocks 3 and the optical coupling protrusions 4 is made from silicone, and the light guide 2 is made from glass or polymethylmethacrylate (PMMA). Alternatively, each of the optical blocks 3 and the optical coupling protrusions 4 may be made from PMMA.

Figure 10:
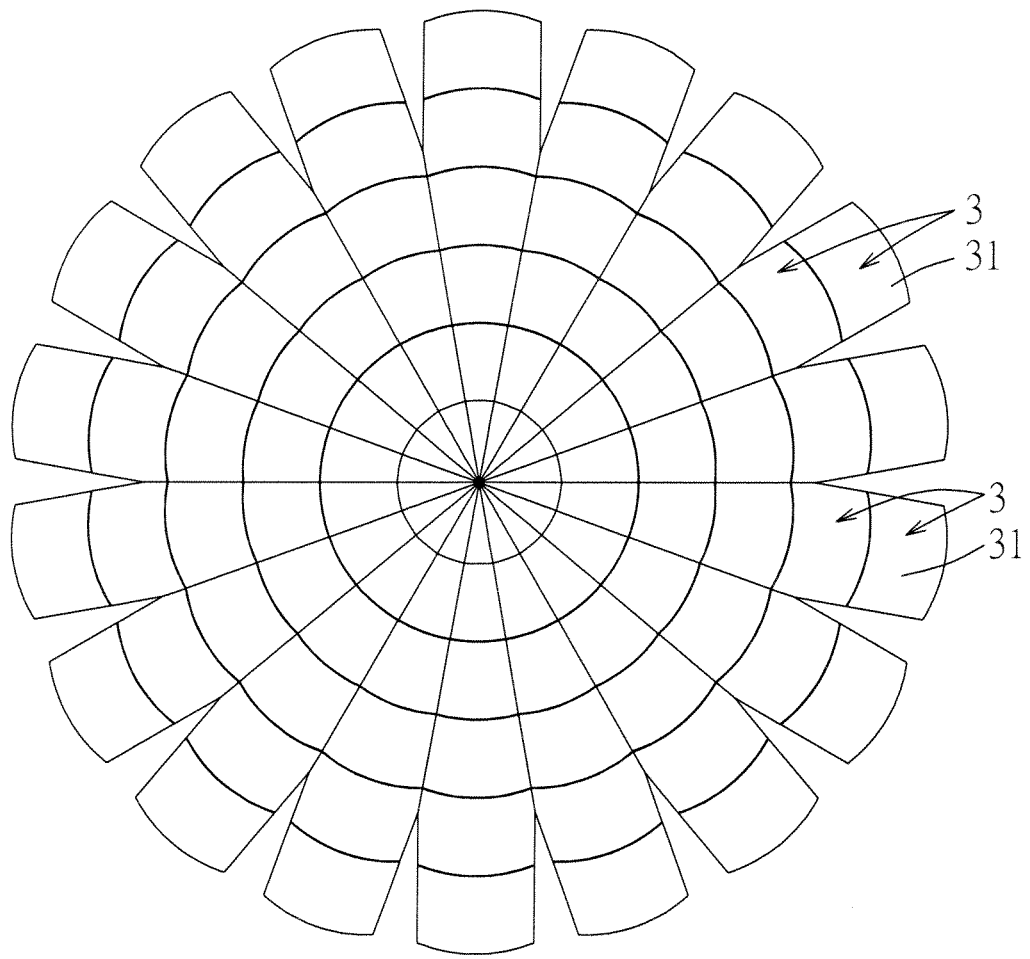
FIG. 10 is a top view of the second embodiment of the light collector according to the present disclosure.
Figure 11:
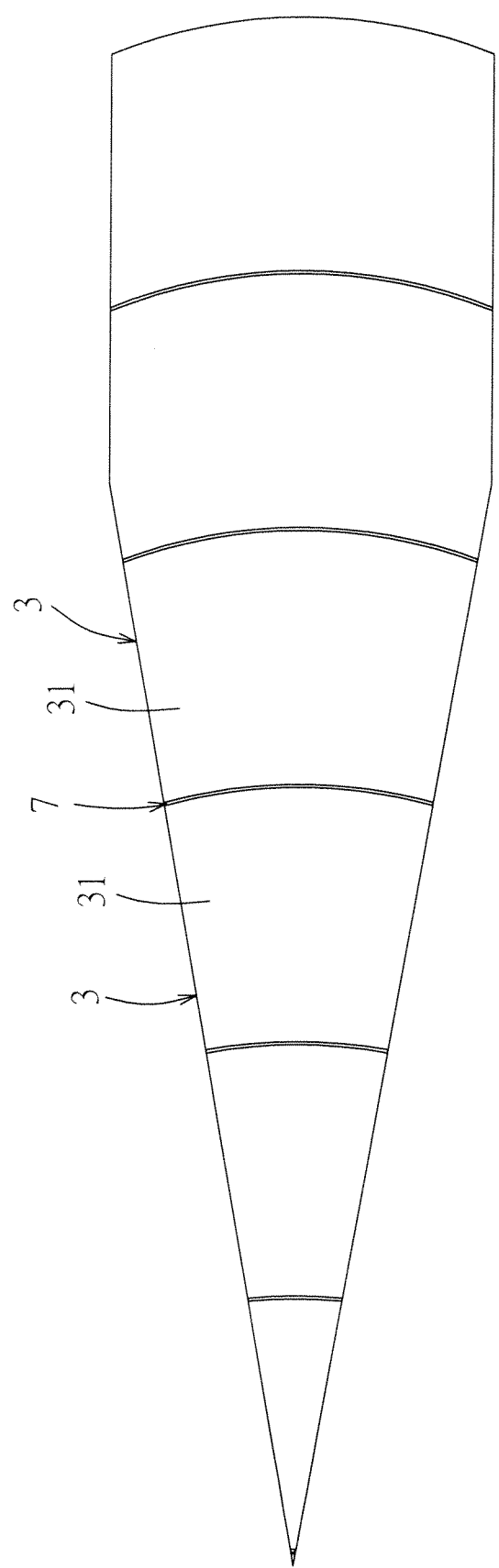
FIG. 11 is a top view of a row of the optical blocks of the second embodiment.

FIGS. 10 and 11 illustrate the second embodiment of the light collector according to the pre sent disclosure.

The second embodiment differs from the previous embodiment in that the array of the optical blocks 3 includes a plurality of rows that are angularly displaced from one another, such that the array is arranged into a circular shape. In certain embodiments, the optical blocks 3 of each row gradually and proportionally increase in size in a radial direction from a center of the circular shape of the array toward a periphery of the circular shape of the array.

While the present disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:
1. A light collector comprising:
a light guide having a light-entrance surface;

a plurality of spaced apart optical blocks that are disposed over said light-entrance surface of said light guide and that are arranged in an array, said array including at least one row of said optical blocks, each of said optical blocks having top and bottom surfaces and front and rear surfaces, said bottom surface being spaced apart from said light-entrance surface of said light guide by a clearance and having front and rear edges, said front and rear surfaces extending curvedly and frontwardly from said top surface to said front and rear edges of said bottom surface, respectively, and being aligned with each other along a row direction, said rear surface exhibiting total internal reflection and having a focal point such that light reflected from said rear surface converge at said focal point, said focal point being disposed adjacent to said front edge of said bottom surface and distal from said rear edge of said bottom surface; and a plurality of optical coupling protrusions, each of which protrudes outwardly from said bottom surface of a corresponding one of said optical blocks, each of which is disposed at said focal point of said rear surface, and each of which is coupled to said light-entrance surface of said light guide for coupling the light reflected from said rear surface into said light guide;

wherein said front surface of one of every two adjacent ones of said optical blocks overlaps said rear surface of the other of every two adjacent ones of said optical blocks along a normal direction of said light guide that is transverse to the row direction; and wherein said front surface of one of every two adjacent ones of said optical blocks cooperates with said rear surface of the other of every two adjacent ones of said optical blocks to define a gap therebetween.

2. The light collector as claimed in claim 1, wherein said front surface of each of said optical blocks is substantially parallel to said rear surface of said each of said optical blocks.

3. The light collector as claimed in claim 2, wherein said front surface of one of every two adjacent ones of said optical blocks is substantially parallel to said rear surface of the other of every two adjacent ones of said optical blocks.

4. The light collector as claimed in claim 3, wherein said top surface has front and rear edges that are opposite to each other along the row direction, said rear edge of said top surface of one of every two adjacent ones of said optical blocks being substantially aligned with said rear edge of said bottom surface of the other of every two adjacent ones of said optical blocks along the normal direction of said light guide.

5. The light collector as claimed in claim 1, wherein said rear surface of each of said optical blocks is parabolic.

6. The light collector as claimed in claim 1, wherein said bottom surface of each of said optical blocks is planar.

7. The light collector as claimed in claim 1, wherein each of said optical blocks further has first and second side surfaces extending between said top and bottom surfaces and between said front and rear surfaces, and substantially transverse to said light-entrance surface of said light guide.

8. The light collector as claimed in claim 7, wherein said first and second side surfaces of each of said optical blocks are planar.

9. The light collector as claimed in claim 1, wherein each of said optical coupling protrusions is tapered and has a planar bottom surface that is in contact with said light-entrance surface.

10. The light collector as claimed in claim 1, wherein said array of said optical blocks includes a plurality of parallel rows.

11. The light collector as claimed in claim 1, wherein said array of said optical blocks includes a plurality of rows that are angularly displaced from one another.

12. The light collector as claimed in claim 1, wherein each of said optical blocks is made from silicone.

13. The light collector as claimed in claim 1, wherein said light guide is made from glass or polymethylmethacrylate (PMMA).

* * * * *